United States Patent
Hauenstein

(10) Patent No.: US 7,619,302 B2
(45) Date of Patent: Nov. 17, 2009

(54) HIGHLY EFFICIENT BOTH-SIDE-COOLED DISCRETE POWER PACKAGE, ESPECIALLY BASIC ELEMENT FOR INNOVATIVE POWER MODULES

(75) Inventor: Henning M. Hauenstein, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 35 days.

(21) Appl. No.: 11/751,930

(22) Filed: May 22, 2007

(65) Prior Publication Data

US 2007/0273009 A1    Nov. 29, 2007

Related U.S. Application Data

(60) Provisional application No. 60/747,952, filed on May 23, 2006.

(51) Int. Cl.
*H01L 23/495*    (2006.01)
(52) U.S. Cl. ...................................... 257/666
(58) Field of Classification Search ................ 257/314, 257/666, 723, 676, E23.004, 690, 668, 675, 257/692, 698, 706, 712, 728, 782, 672, 691, 257/685, 497, 773, 901, 109, 904, 401
See application file for complete search history.

(56) References Cited

U.S. PATENT DOCUMENTS

| | | | | |
|---|---|---|---|---|
| 6,072,240 | A * | 6/2000 | Kimura et al. | 257/735 |
| 6,448,645 | B1 * | 9/2002 | Kimura et al. | 257/735 |
| 6,490,161 | B1 | 12/2002 | Johnson | |
| 6,946,730 | B2 * | 9/2005 | Teshima | 257/718 |
| 7,005,734 | B2 | 2/2006 | Choi et al. | |
| 7,019,395 | B2 | 3/2006 | Hirano et al. | |
| 7,250,674 | B2 * | 7/2007 | Inoue | 257/712 |
| 2005/0167821 | A1 * | 8/2005 | Mamitsu et al. | 257/718 |
| 2005/0280142 | A1 * | 12/2005 | Hua et al. | 257/707 |

OTHER PUBLICATIONS

International Search Report dated Feb. 27, 2008 issued in PCT Application No. PCT/US07/12328.

* cited by examiner

*Primary Examiner*—Dao H Nguyen
*Assistant Examiner*—Tram H Nguyen
(74) *Attorney, Agent, or Firm*—Farjami & Farjami LLP

(57) ABSTRACT

Two DBC wafers have patterned first conductive surfaces which receive a semiconductor die in sandwich fashion. Lead frame terminally extending into the package interior and are connected to the die terminals. The outer conductive surfaces of each of the wafers are available for two-sided cooling of the semiconductor.

18 Claims, 16 Drawing Sheets

HIGHLY EFFICIENT BOTH-SIDE-COOLED DISCRETE POWER PACKAGE, ESPECIALLY BASIC ELEMENT FOR INNOVATIVE POWER MODULES

RELATED APPLICATIONS

This application claims the benefit of U.S. Provisional Application No. 60/747,952, filed May 23, 2006 entitled HIGHLY EFFICIENT BOTH-SIDE-COOLED DISCRETE POWER PACKAGE, ESPECIALLY BASIC ELEMENT FOR INNOVATIVE POWER MODULES (IR-3253 Prov) the entire disclosure of which is incorporated by reference herein.

This application is also related to U.S. Ser. No. 11/641,270 filed Dec. 19, 2006 entitled PACKAGE FOR HIGH POWER DENSITY DEVICES (IR-3174), Provisional Application Ser. No. 60/756,984 filed Jan. 6, 2006 entitled BOND-WIRE-LESS POWER PACKAGE WITH INTEGRATED CURRENT SENSOR, ESPECIALLY SHORT CIRCUIT PROTECTION (IR-3175 Prov) and Provisional Application Ser. No. 60/761,722 filed Jan. 24, 2006 entitled STRESS-REDUCED BOND-WIRELESS PACKAGE FOR HIGH POWER DENSITY DEVICES (IR-3177 Prov), the entire disclosures of which are incorporated by reference herein.

FIELD OF THE INVENTION

This invention relates to semiconductor device packages and processes for their manufacture, and more specifically relates to such packages which can be cooled from both sides of the package.

BACKGROUND OF THE INVENTION

The use of a double bonded copper (DBC) wafer as a housing for a semiconductor device is disclosed in the related applications described above, particularly application Ser. No. 11/641,270 (IR-3174). In these devices, the conductive surface of the top copper layer of the wafer is patterned to have a flat depressed surface which receives the bottom electrode of one or more semiconductor devices, for example, IGBTs or power MOSFETs (or any other MOSgated device), diodes or the like. The top electrodes of the die may then be mounted on a suitable substrate. The package may also be cooled, particularly from the opposite or bottom side of the DBC wafer.

BRIEF DESCRIPTION OF THE INVENTION

In accordance with the invention, a second DBC wafer is provided with its top conductive layer patterned to receive the top electrodes of one or more semiconductor die mounted within the depression of the conductive layer of a first DBC wafer (as in application Ser. No. 11/641,270), with the two wafers connected in sandwich fashion on the centrally contained semiconductor die. The outer conductive layers of both wafers are then exposed for two surface cooling of the semiconductor die within the sandwich. A lead frame with electrode terminals can also be captured between the two wafers and will extend beyond the periphery of the sandwich for connection to external circuits.

A conductive U-shaped clip can be fastened to the opposite surface of the package for enhanced cooling and can be immersed in a cooling fluid.

The invention provides numerous advantages.

Thus, the invention provides:
a) improved mechanical properties:
  i) a stress-reduced, both-sided cooled semiconductor die.
  ii) material selection with thermally matched expansion coefficients to the semiconductor die.
  iii) increased reliability due to matched thermal expansion coefficients
  iv) a hermetically sealed and rugged package usable in harsh environments with direct liquid coolant contact.
b) improved electrical and thermal properties:
  i) low inductance of the overall co-package due to the use of a large soldered contact area for all pads of the semiconductor devices.
  ii) increased current/power capability due to low electrical and thermal resistance, using solder die attach and large contact areas with two sided cooling.
  iii) electrical isolation on both sides of the semiconductor die.
  iv) optimized usage of the available package space and therefore optimized power density.
c) improved manufacturing and handling properties:
  i) the pre-assembled component package is suitable for easy handling and integration into power modules.
d) low manufacturing and test costs due to:
  i) high volume production is possible without application specific customization which can be done by the end-customer who can combine the devices to customized circuits or power modules.
  iii) electrical/parametric end-tests can be done on a DBC card level before separating the card into discrete packaged elements.
  iv) complete package can be tested and qualified similar to discrete standard packages leading to product release following standard qualification processes).
e) unique customer advantages:
  i) the component package matches the thermal expansion coefficient of state-of-the-art power substrates and therefor is attractive for a large variety of applications.
  ii) application-flexibility of the assembly can easily be combined to an application specific circuit at the end-customer using the package as a basic "construction-kit".
  iii) application-flexibility due to various possibilities for customized external leads and terminals while keeping the more expensive DBC-substrates and the main package outline and footprint application-independent.
  iv) cost-effective material choice by matching the ceramic type of the DBC (e.g. $Al_2O_3$—, AlN—, SiN—, . . . ceramics) to the application requirements.
f) easy implementation of optional features:
  i) the package is a basic element enabling a highly efficient and innovative space saving vertical integration into the heatsink or power module base plates.
  ii) both sided cooling and even direct liquid cooling is feasible due to the HV isolation of the package, offering highest possible power and package densities.
  iii) an additional EMI screening function can be implemented by using the exposed Cu layer of the DBC-elements of the package as grounded EMI-shielding.
  iv) easy integration of "smartness" such as gate-drivers or sensors attached to the HV-isolated package e.g. on the exposed Cu-pads.

A major application for the package of the invention is in high power circuits and modules for switching high currents or high voltages and requiring low inductance and EMI-screening. High voltage applications using a combination of IGBTs and diodes or Power MOSFETs as well as applications in harsh environmental conditions or difficult temperature cycling requirements (such as automotive applications or safety critical functions) have a high reliability demand which is satisfied by the present invention. Further applications having very limited space conditions and high power demand will benefit from the invention.

DETAILED DESCRIPTION OF THE PREFERRED EMBODIMENT

Figure 1:
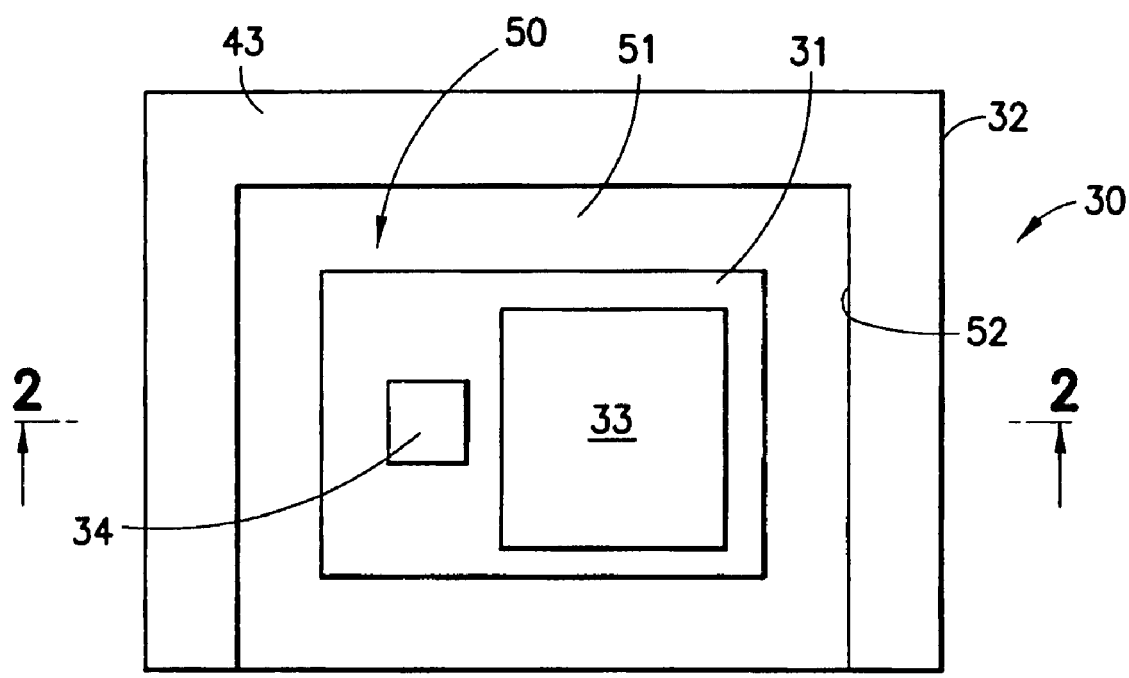
FIG. 1 is a top view of a package employing a single DBC wafer as disclosed in application Ser. No. 11/641,270 (IR-3174).
Figure 2:
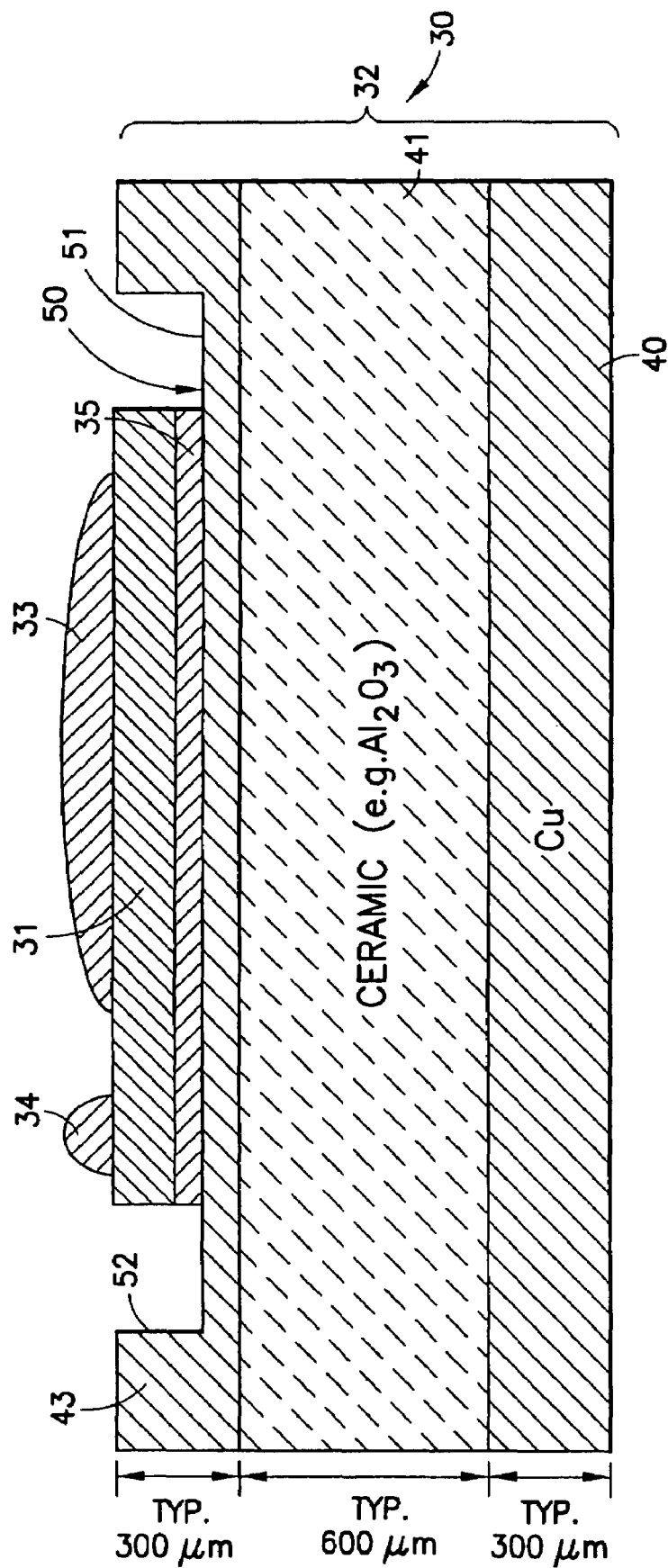
FIG. 2 is a cross-section of FIG. 1 taken across section line 2-2 in FIG. 1.
Figure 3:
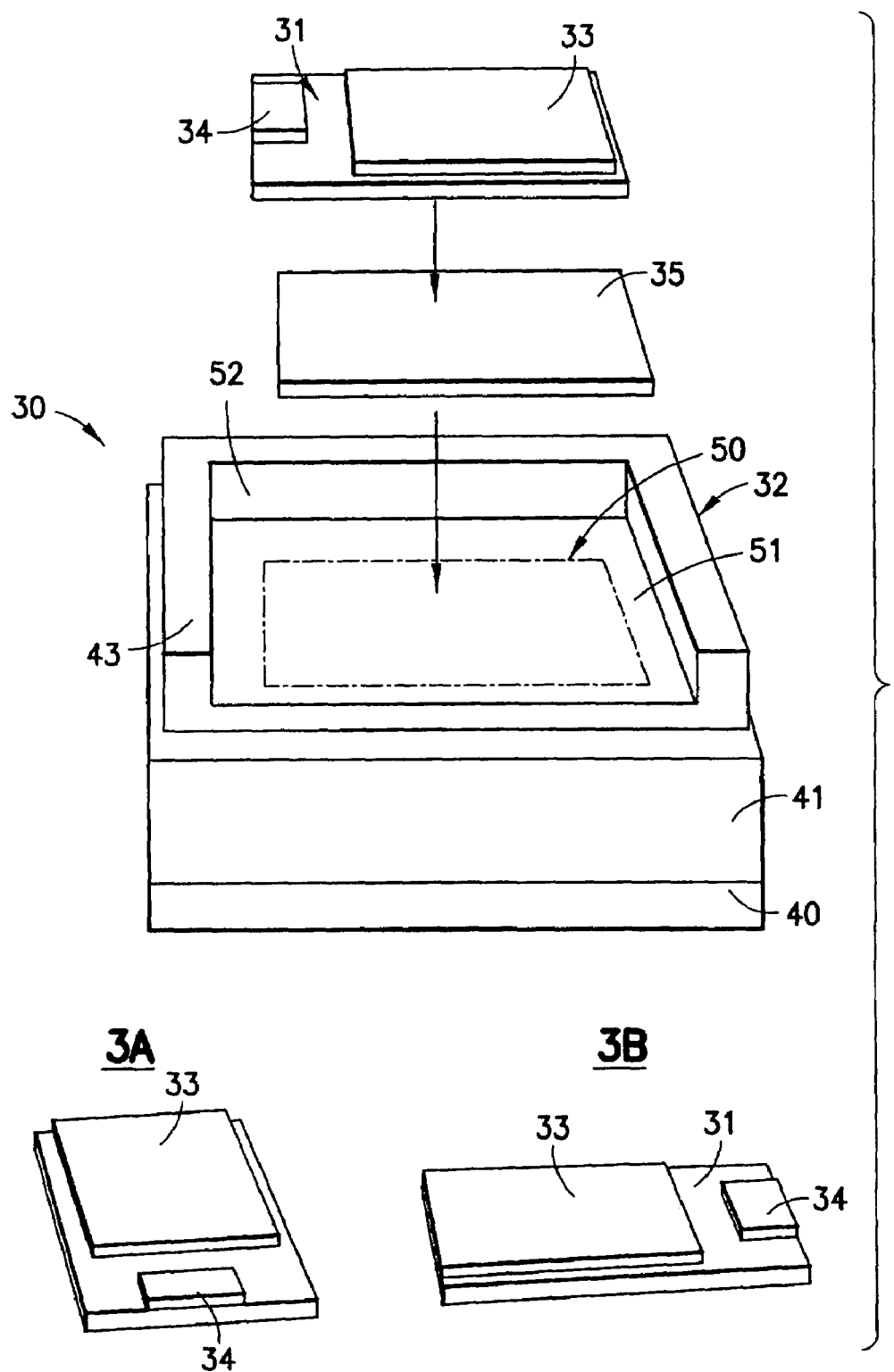
FIG. 3 is an exploded perspective view of FIGS. 1 and 2 and shows alternate orientations for the semiconductor die of the package.

FIGS. 1, 2 and 3 show a first embodiment of the semiconductor device 30 of copending application Ser. No. 11/641, 270 (IR-3174). The semiconductor device 30 comprises a semiconductor die 31 and a housing 32.

Semiconductor die 31 may be a silicon based vertical conduction power MOSFET having, on one surface, a source electrode which receives a solder bump 33, a gate electrode which receives a solder bump 34 and, on its opposite surface, a drain electrode which receives solder preform 35. Solderable metal pads can be used in place of the solder bumps and solder paste can be used in place of the solder preform. While die 31 is shown as a silicon die, it may be of any type of semiconductor material including Gallium Nitride, silicon carbide and the like. Further, while die 31 is described as a power MOSFET, it can be any type of semiconductor device, including a bipolar transistor die, an IGBT die, a break over device die, a diode die and the like. A copack of an IGBT and diode can be laterally spaced from one another and have their top and bottom electron inter-connected. The term MOSgated device is intended to refer to any type of semiconductor switching device with power electrodes on at least one surface thereof and a gate to switch the device between on and off conditions. The terms source electrode or source contact are intended to identify the source of a MOSFET or the emitter of an IGBT. Similarly, the terms drain electrode or contact and collector electrode or contact (for an IGBT) are intended to be interchangeably used.

The housing 32 may be a wafer consisting of a bottom conductive layer 40 which is bonded to an insulation layer 41 at its bottom surface, and a top conductive layer 43 which is bonded to the insulation layer at its top. This type of structure is referred to as "DBC". Top conductive layer 43 is patterned to have a depression 50 etched or otherwise formed therein and having a flat bottom surface 51 at least partly surrounded by a rim 52. The surfaces of depression 51 and rim 52 may, for example, be nickel plated to optimize solder wetting and to passivate the can against oxidation, and to increase reliability by changing the intermetallic between solder and the copper and the silicon or other material of the die to be soldered to surface 51.

The conductive materials used for layers 40 and 43 may be any high conductivity metal, such as, and preferably copper, although other metals can be used. The center layer 41 may be any good electrical insulation to insulate layers 40 and 43 from one another and could be a ceramic, preferably $Al_2O_3$. As further examples, AlN and SiN may also be used. The layers 40 and 43 may be of any desired thickness, typically 300 μm but can have any other desired thickness, typically between 300 to 600 μm. Such DBC materials are commercially available and are commonly used in semiconductor device modules where copper layers 40 and 43 are to be electrically insulated, but in thermal communication so heat generated in one layer can flow through the insulation barrier 41 to the other conductive layer.

The depression 51 will have a depth sufficient to receive solder layer 35 which typically may be less than about 100 μm thick and the die 31 which typically may be thinned to less than about 100 μm. In the example of FIG. 1, the die is 70 μm thick and the solder 35 is about 100 μm thick, leaving a web of copper 130 μm thick between surface 51 and the top surface of insulation layer 41.

Die 31 is appropriately soldered to the surface 50 of depression 50 with the top surface of die 31 at least approximately coplanar with the top of rim 52. Solder bumps 33 and 34 project above this plane so that the package can be inverted and the contact bumps soldered to traces on a circuit board without need for wire bonds. Alternatively, solderable pads can be used in place of the solder bumps for later solder attach. Heat generated at die 31 during its operation is conducted through ceramic 41 to the copper layer 40 which can dissipate heat from the package and, in particular, can be thermally connected to a heat sink which will be electrically insulated from the drain 35 and conductive layer 40.

While a relatively large gap is shown between the outer periphery of die 31 and the inner surface of rim 52, this space can be reduced to the smallest dimension consistent with manufacturing ease and convenience. Further, the remaining gap may be filled with an insulation bead.

FIG. 3 schematically shows two other examples of orientations for die 31 at locations 3A and 3B.

Figure 4:
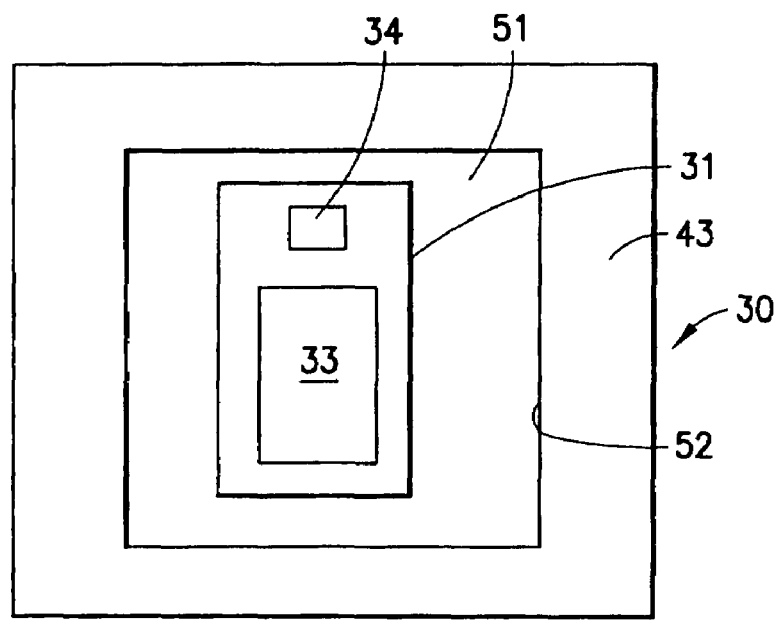
FIGS. 4 and 4A are a top view of an alternative structures for the package.
Figure 4A:
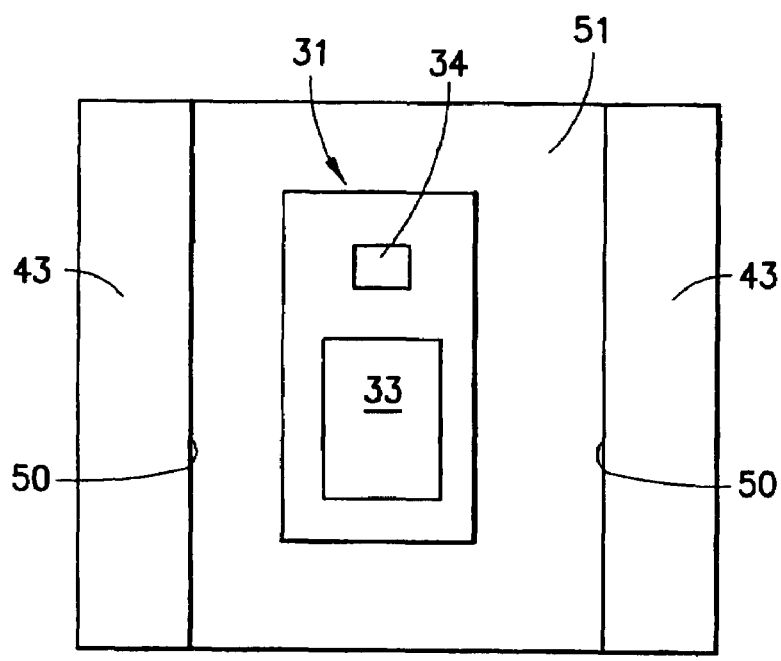

The rim 52 of copper layer 43 is shown to be a horse shoe or U-shape in FIGS. 1, 2 and 3. Other configurations can be used. For example, in FIG. 4, where components similar to those of FIGS. 1, 2 and 3 have the same identifying numerals, the depression 51 in layer 43 is completely enclosed by a rim 50. FIG. 4A shows another embodiment in which both ends of the rim 43 are removed or opened to simplify contact to the gate and source contacts 34 and 33 respectively. Further, in the embodiment of FIG. 4A, air inclusion is less likely to occur during molding or gel filling.

Figure 5:
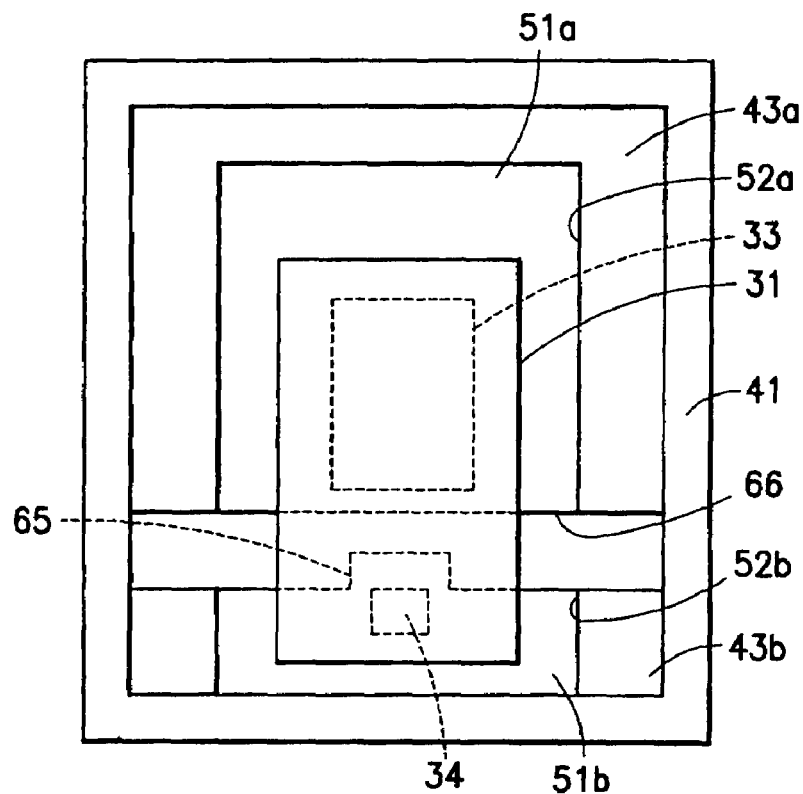
FIG. 5 is a top view of a further alternative of the package of FIGS. 1, 2 and 3 in which the die is inverted.
Figure 6:
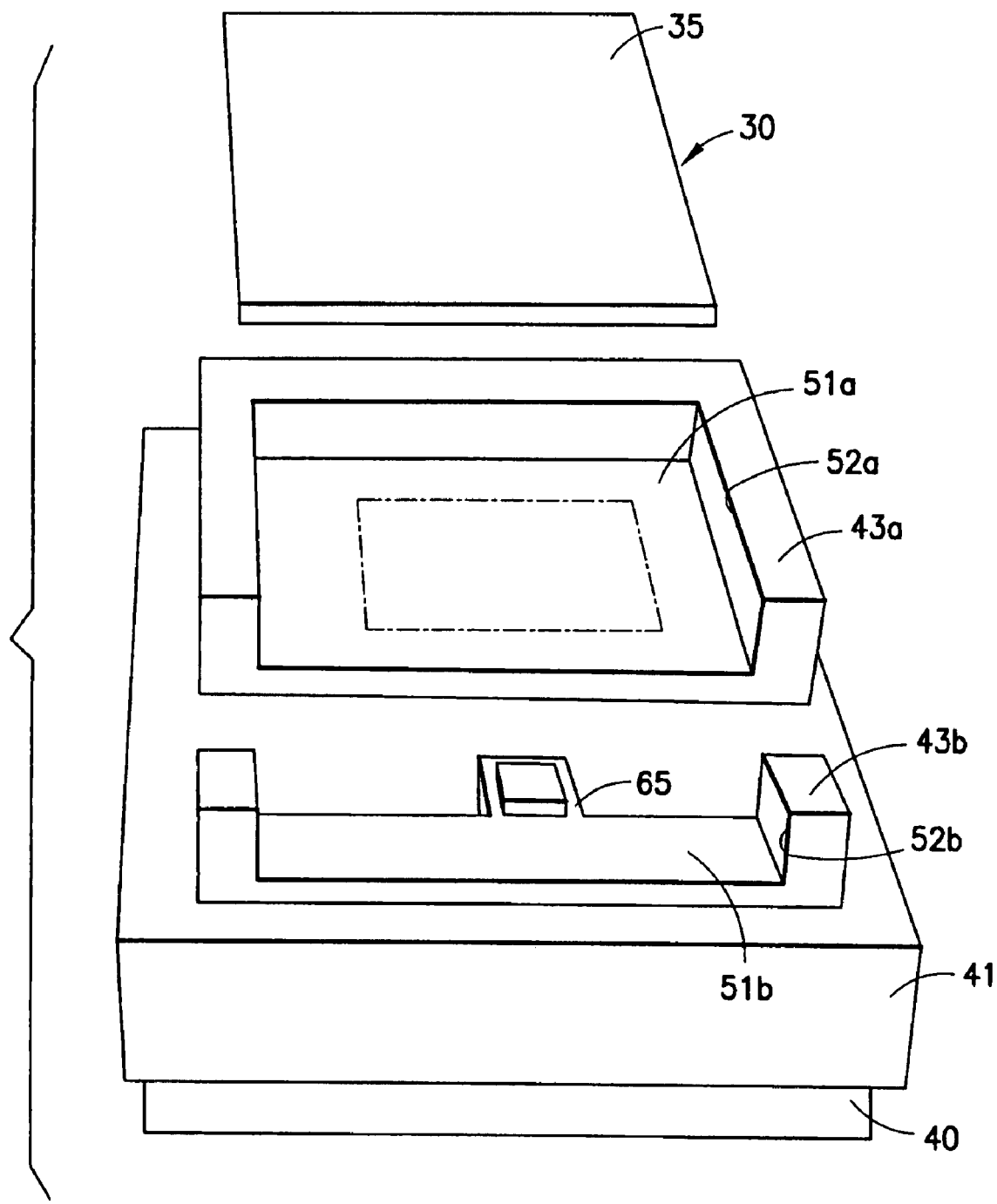
FIG. 6 is an exploded perspective view of the embodiment of FIG. 5.

FIGS. 5 and 6 show another embodiment and, as will be the case hereinafter with all drawings, the same number identifies similar components. FIGS. 5 and 6 show the die 31 of FIGS. 1 to 4 flipped over so that the source and gate bumps (or the equivalent bumps of an IGBT or the like) face the depressed flat surface 51. Thus, in FIGS. 5 and 6, the upper copper layer 43 of FIGS. 1 to 4 is separated into segments 43a and 43b with respective rim segments 52a and 52b and flat depression base portions 51a and 51b. A short tongue 65 extends from depression body 51b. The flipped die 31 may then be soldered with source bump 33 soldered to surface 51a and gate bump 34 soldered to surface 51b and insulted from source bump 33 by the gap 66 in top conductive layer 43a-43b.

Figure 7:
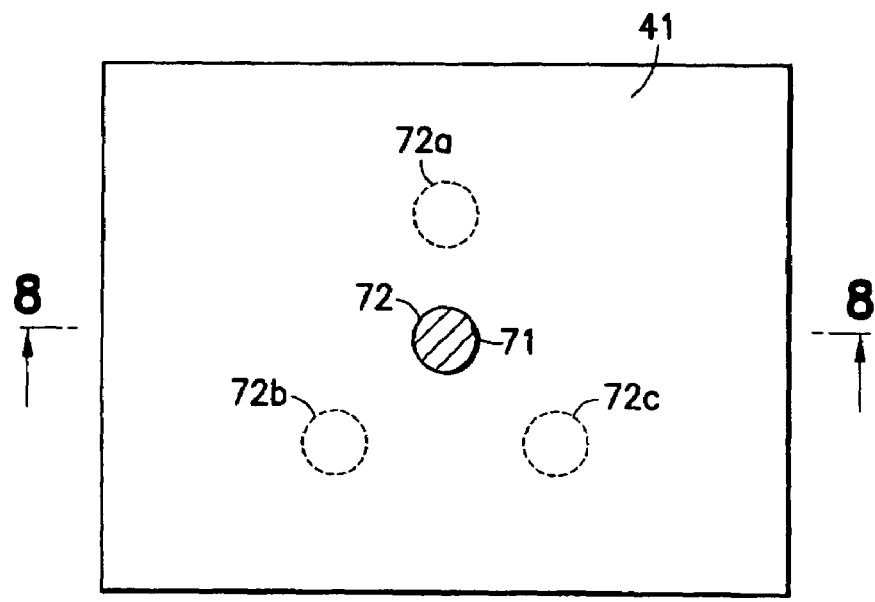
FIG. 7 is a top view of a further embodiment of the device of FIGS. 1 to 6 in which a resistive shunt via is formed in the DBC substrate.
Figure 8:
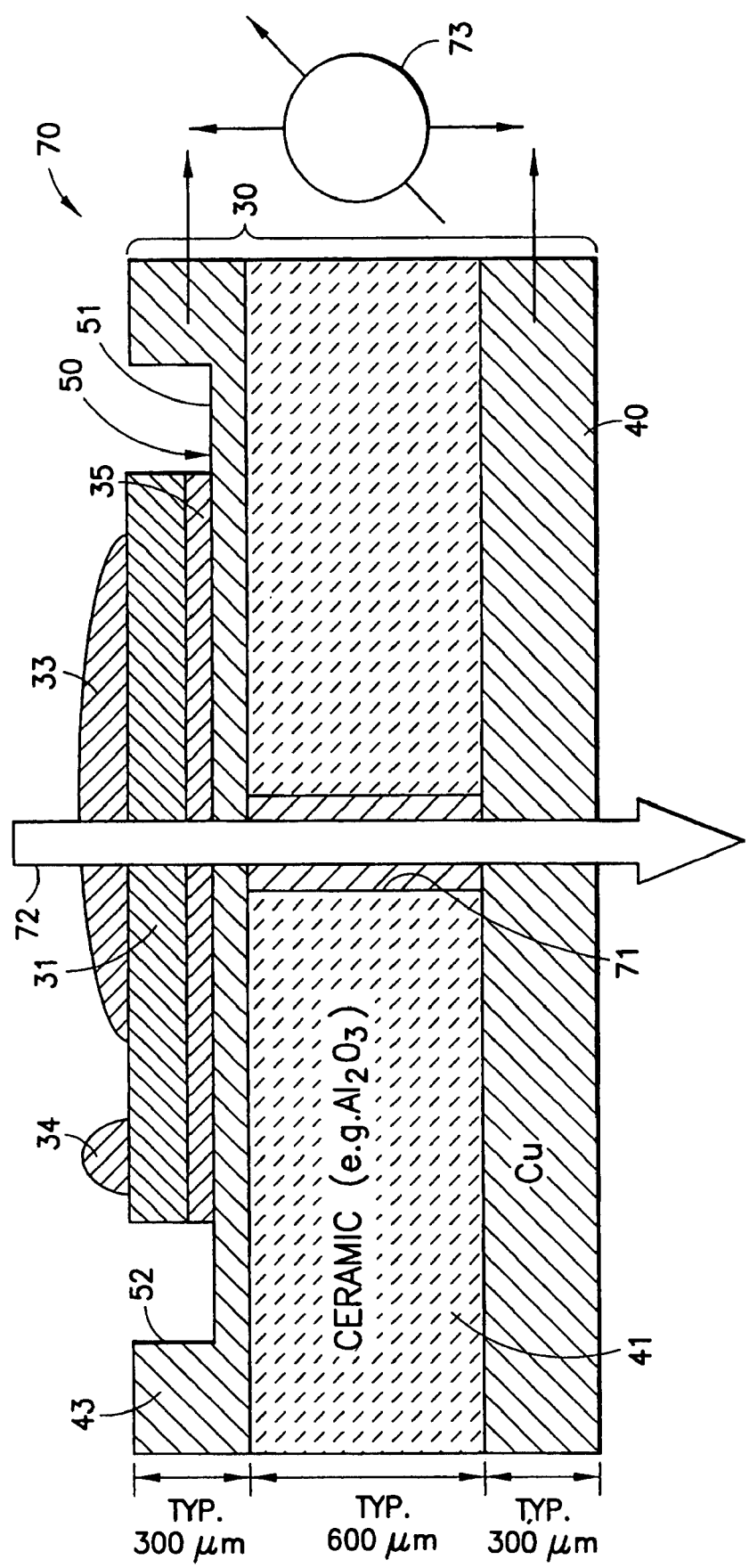
FIG. 8 is a cross-section of FIG. 7, taken across section line 8-8 in FIG. 7 and further shows a MOSFET die in the depression in the upper copper layer of the DBC wafer.

FIGS. 7 and 8 show a further embodiment in which at least one resistive current shunt is formed in package 70 (FIG. 8). Thus, the insulation layer 41 in FIG. 7 has a thru-opening 71 drilled or otherwise formed before copper layers 40 and 43 are bonded thereto. The thru-opening 71 can also be formed after the layers 40 and 43 are bonded to insulation 41. A suitable electrically conductive material 72 (FIG. 8) then fills the opening 71 to connect layers 40 and 43 and to form shunt resistor.

The required shunt resistance depends on the application and can be sized at greater than about desired 0.1 mohm although any resistance value can be created. The value of the shunt resistance will be a compromise between the acceptable power loss within the shunt and the voltage drop 73 across the shunt resistor 72. Note that the shunt 72 is integrated into the thermal path of the package 70 and will be automatically cooled by the heat sink or other thermal management cooling for the die 31.

The resistance of shunt 72 will depend on the geometry and length of thru hole 71 and the resistivity of the shunt material 72. The hole 71 is shown with a circular cross-section, but it could have any other shape. Its length will be that of the thickness of insulation layer, which, when a ceramic such as $Al_2O_3$ will be from 300 μm to 600 μm.

The material used for shunt 72 may be any desired conductor, for example, copper or solder, or may be materials such as manganin which have a relatively lower thermal coefficient of resistance. Plural parallel shunts equally or symmetrically distributed over the surface of the insulation layer 21 may also be used, shown in FIG. 7 by dotted circles 72a, 72b, 72c which will be under the relevant die electrode. This offers the advantage of lower inductance, higher shunt current and more equal shunt current distribution.

Figure 9:
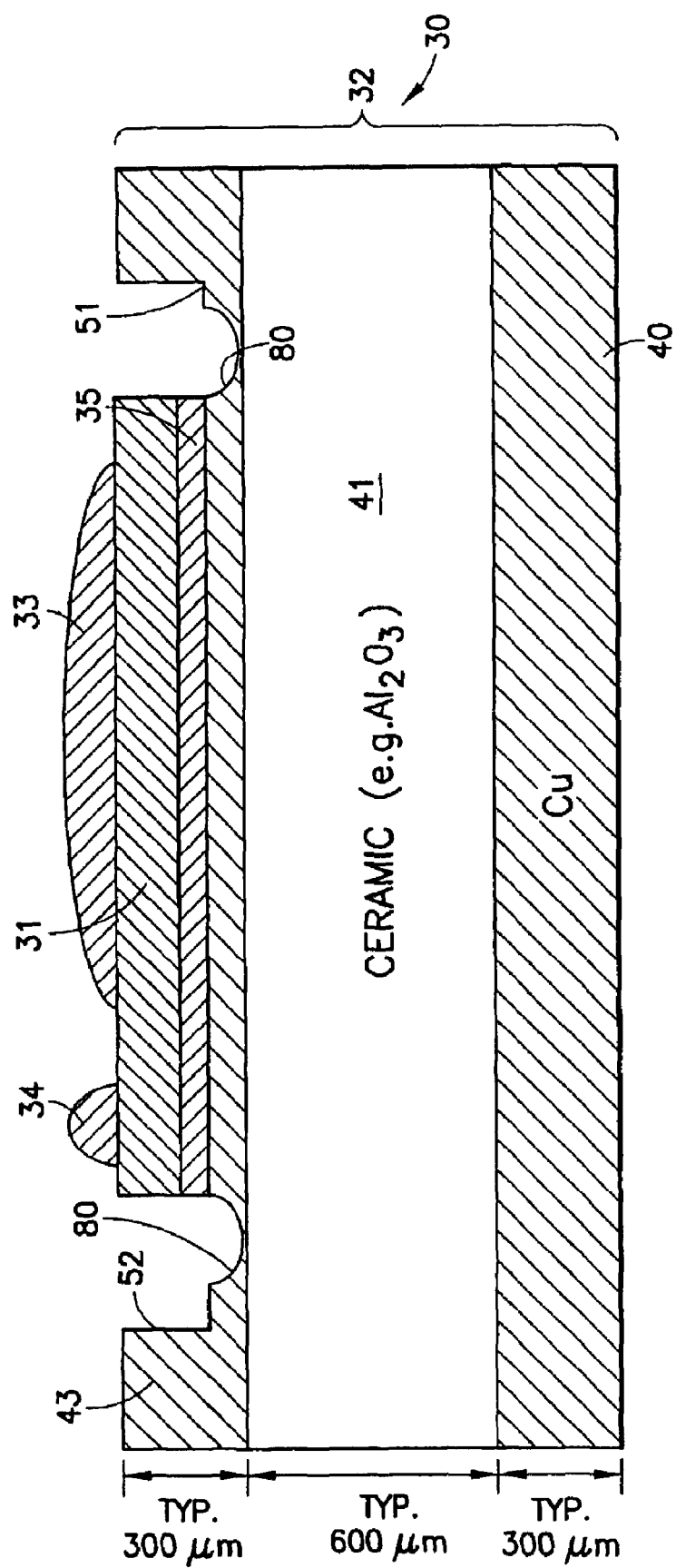
FIG. 9 is a cross section of a package, like that of FIG. 2, but further containing solder stop dimples to position the die during solder reflow.
Figure 10:
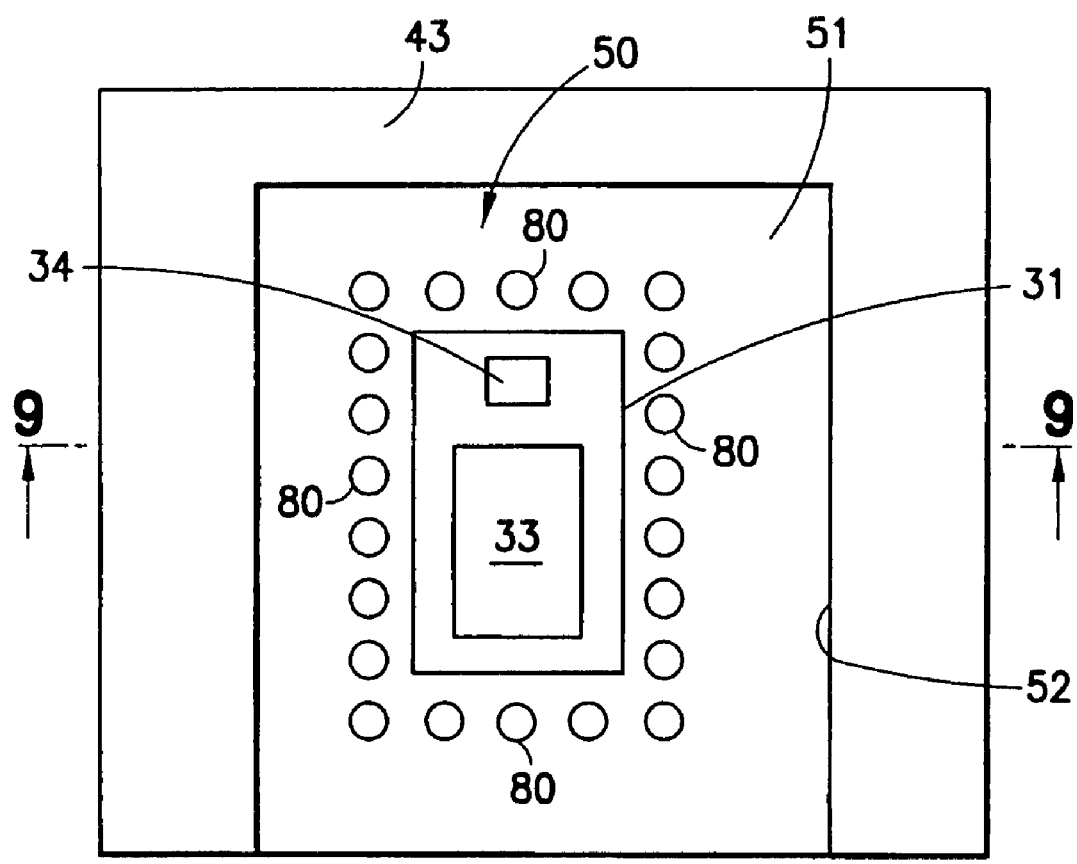
FIG. 10 is a top view of FIG. 9.
Figure 11:
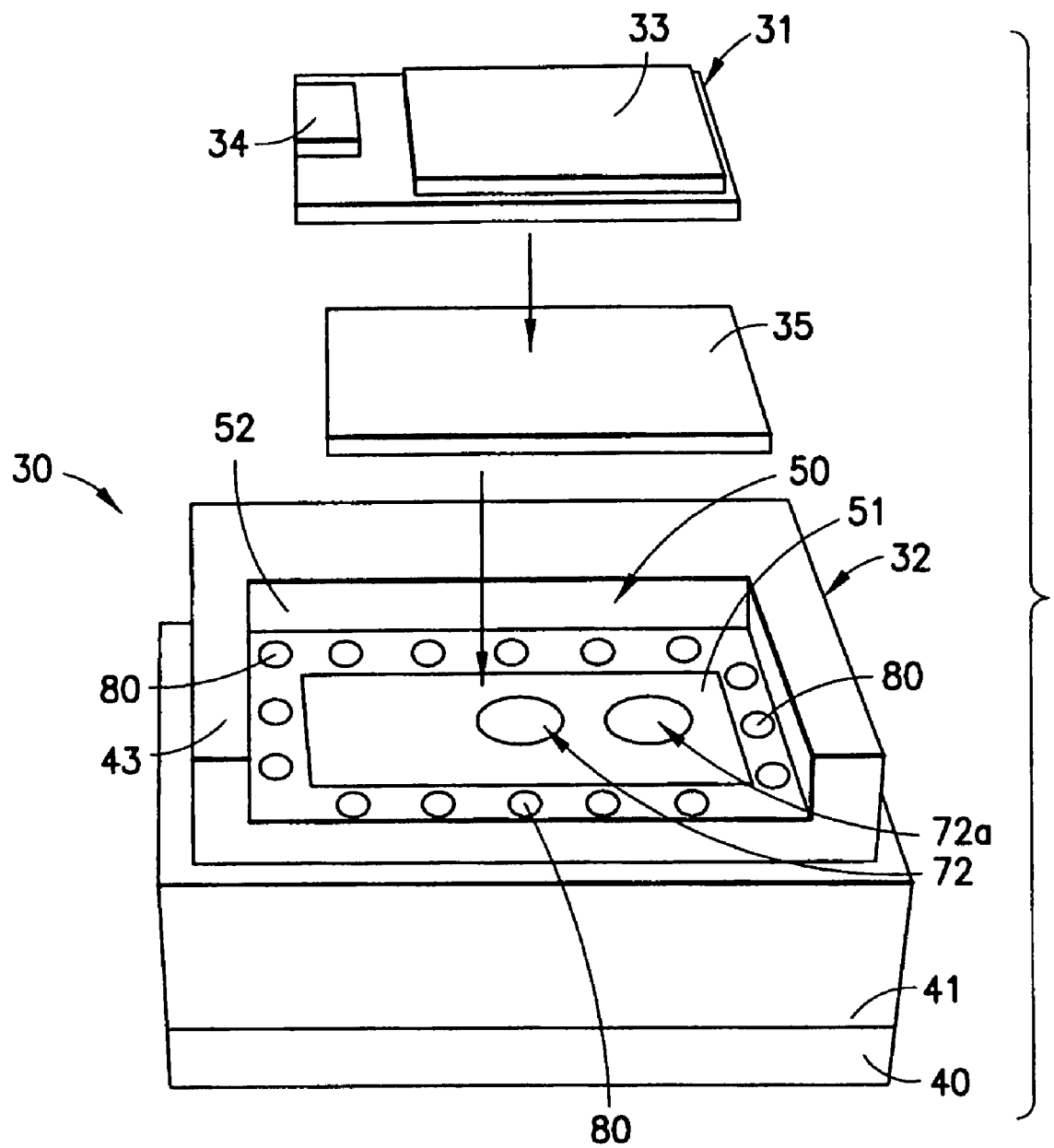
FIG. 11 is an exploded perspective of the package of FIG. 9 with plural resistive shunt vias in the DBC wafer.

Referring next to FIGS. 9, 10 and 11, there is shown a solder stop structure which securely locates the die 31 on surface 51 of device or package 70 of FIG. 8 during die attach and prevents the die edge from contacting the frame 52. Thus, a plurality of depressions or dimples 80 are formed around the desired location of die 31 to self-align the die during the die attach reflow process. Dimples 80 preferably have the rounded bottom shape reaching down to the ceramic 41.

It is also possible to use an isolating lacquer or other solder stop inside the frame 52. A "smooth solder" process may be used, using the preform 35 as shown rather than a solder paste with flux, which can also be used. When using the solder preform 35; the solder process can be carried out in forming gas atmosphere to avoid strong movement of the die inside the DBC can during the soldering process. However, dimples 80 will act as solder stops and also provide stress release inside the can for the bond force between the copper and the ceramic during temperature cycling.

Figure 12:
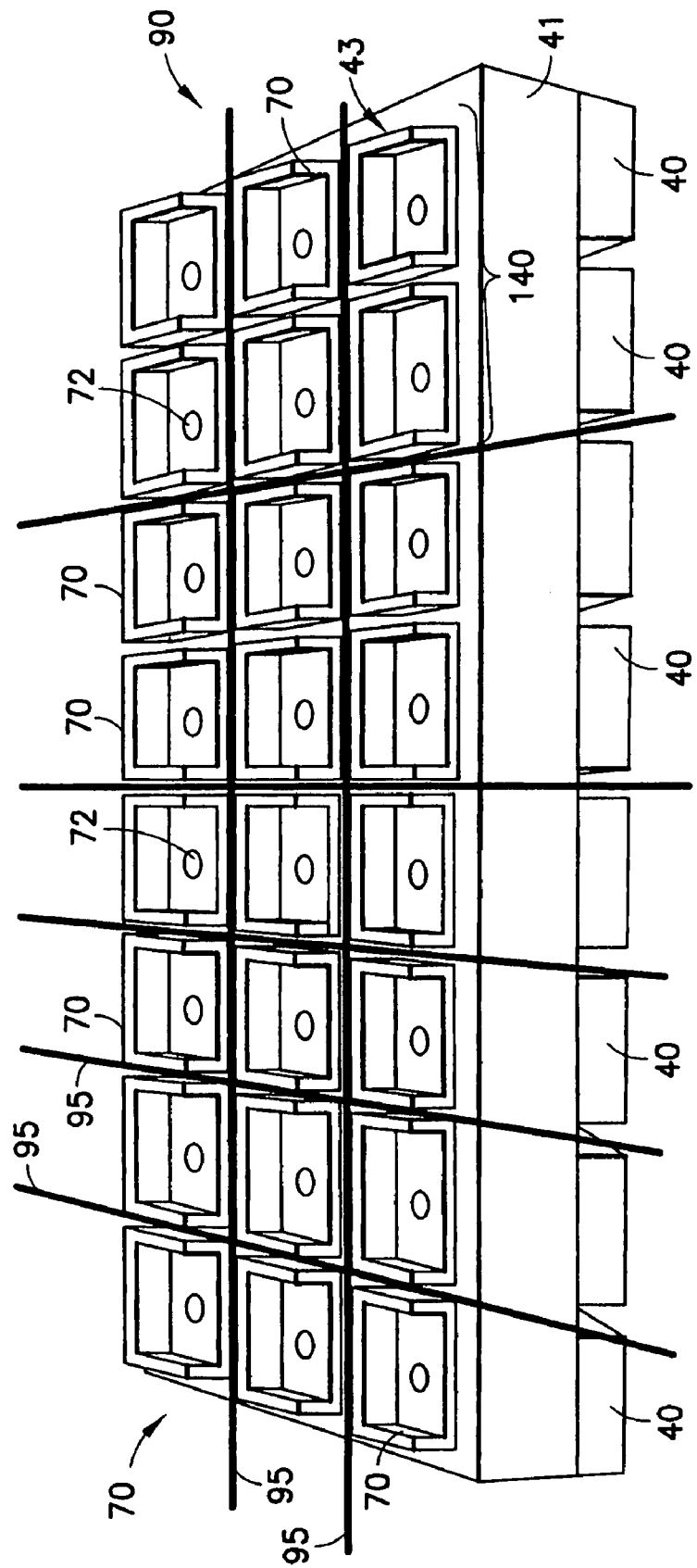
FIG. 12 shows a DBC "card" in which the packages of FIGS. 1 to 10 can be processed in wafer scale and can be singulated individually or in selected groups.

In order to minimize package costs, the individual packages 70 of FIG. 8 (or 30 of FIG. 1) can be formed simultaneously on a DBC card and then singulated from the card. Thus, a DBC card 90 is shown in FIG. 12. Such cards are produced in sizes such as 5"×7" or 4"×6" and have a continuous central ceramic layer 41 with top and bottom copper layers. These layers can be simultaneously masked and etched to define the individual packages 70 (or 30) with the depressions 52 in the top layer as in the prior figures; and with other features such as the shunts 72 and dimples 80 (FIGS. 9 and 10). After the patterning of the packages and the streets 95 between the packages, various die 31 can be loaded into the packages locations. Note that the shunts can be tested before die 31 are assembled and soldered in place, and each package can be tested before singulation of the packages. Further, the die loaded into the packages may be diverse die such as combination of MOSFETs, IGBTs, diodes and the like.

It is very desirable to test the shunt 72 values before any silicon or other die is mounted in the respective package to reduce yield loss. After tests are carried out at wafer level, the DBC cans can be singulated by sawing, dicing or physically breaking at the streets 95.

Note that the packages can be singulated in clusters of two or more packages. Two package clusters are shown on the right hand half of FIG. 12.

Note also that vias may be omitted in selected package locations on the card 12, and in selected ones of a cluster of packages.

The formation of the packages on card 90 has benefits in connection with the shipment of packages to a customer. Thus, the cards can be shipped to a customer intact and singulated by the user at the user's site. The cards can be protected by a suitable foil for shipment and can be prescribed for easy break-off or singulation of packages by the end user.

A further conductive heat sink or plate 131 may be attached by solder or a conductive adhesive glue to the conductive segments of devices 30 to provide additional double-sided cooling for devices 30. The conductive plate 131 is electrically insulated from devices 30 by the insulation layers 31.

In accordance with the invention, a second DBC or other wafer/substrate is provided to make contact with the exposed electrodes at the top surface of the first DBC wafer of FIGS. 1 to 12.

Figure 13:
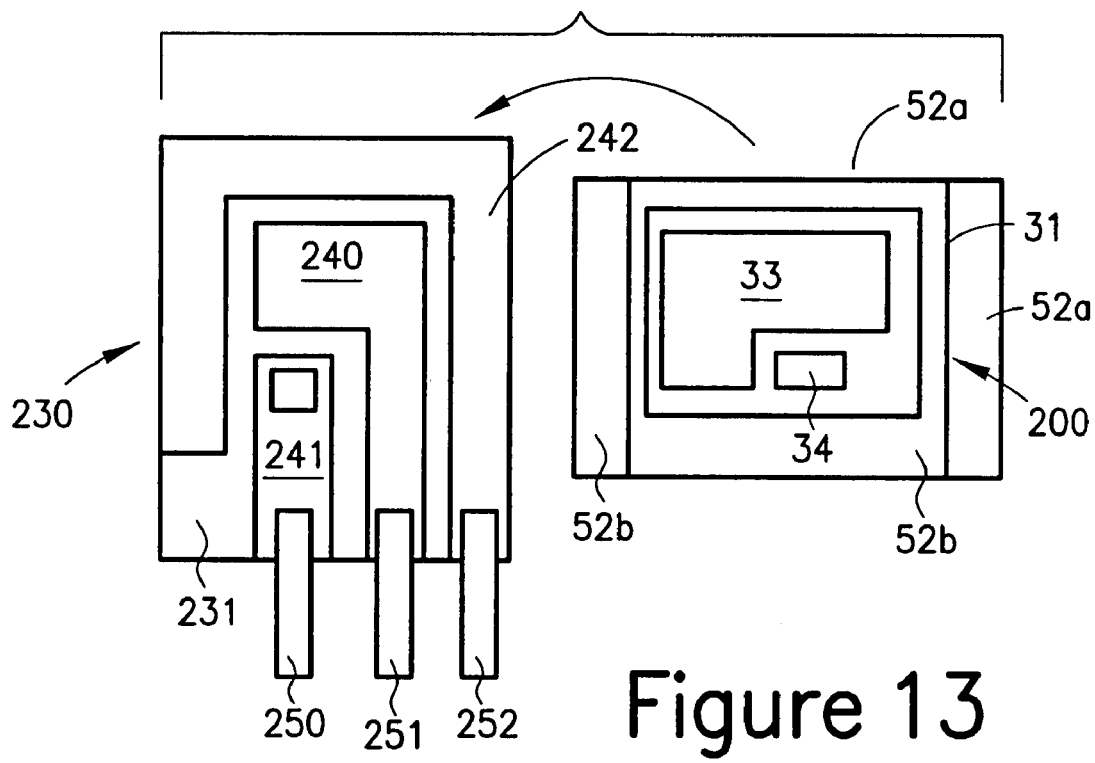
FIG. 13 is a top view of two DBC wafers, one carrying a semiconductor die and the other a connection pattern for the die when the wafers are sandwiched together.
Figure 15:
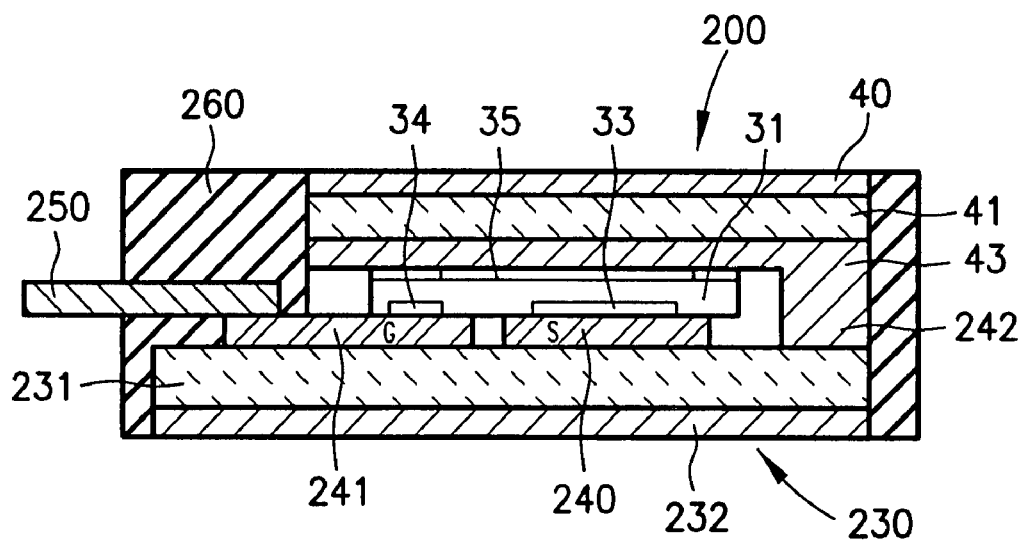
FIG. 15 is a cross-section of FIG. 14 taken across section line 15-15 in FIG. 14.

Thus, FIG. 13 shows a first DBC wafer 200, similar to that of FIGS. 1 to 12 and particularly FIG. 4a in which a MOSFET (or IGBT) die has a source contact 33 (of different shape than that of FIG. 4a) and a gate contact 34. Die 31 is soldered to the surface 50 of depression 51 in copper layer 43 and is spaced as shown from rim portions 52a and 52b. FIGS. 13 and 15 also show the second conductive (copper) layer 40 and insulation substrate 41 for DBC wafer 200.

In accordance with one aspect of the invention, a second DBC wafer assembly 230 is provided (FIGS. 13, 14, 15 and 16) to provide contact connections to the source 33, gate 34 and drain contact 35 of wafer 200 and to provide a second coolable surface to the assembly.

Figure 14:
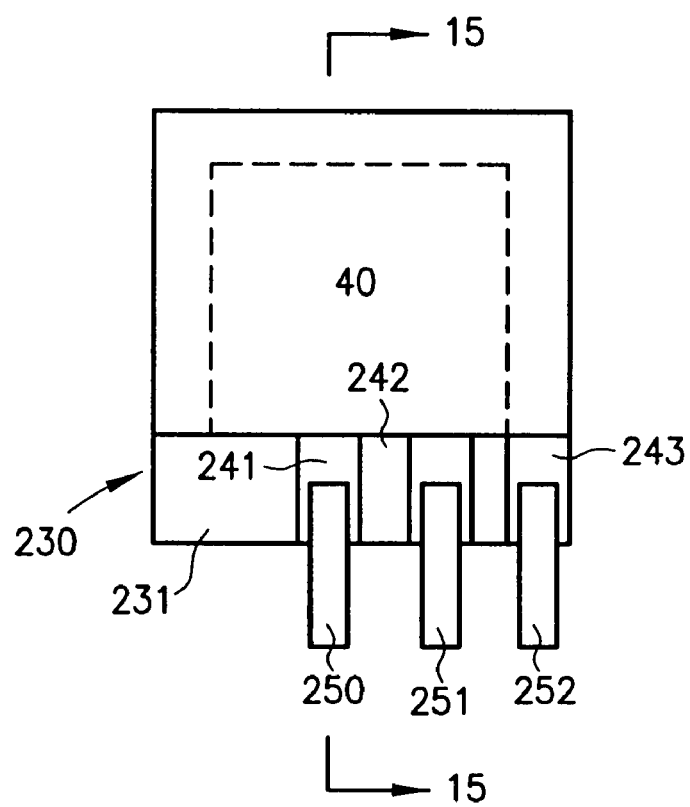
FIG. 14 is a top view of the wafers of FIG. 13 after the sandwiching and connection of the wafers.

Thus, the second DBC wafer 230 consists of a body like that of wafer 200, and having a central ceramic body 231 having a bottom copper layer 232 (FIG. 15) and a patterned top copper layer which is patterned to have a source trace 240, a gate trace 241 and a drain (rim) trace 242. The drain rim 242 can be extended at its left hand side in FIGS. 13 and 14, if desired, and a separate drain contact lead an be connected at that location. All traces are etched down to the surface of ceramic layer 231 to insulate the traces from one another. The traces are arranged such that the wafer 200 can be rotated from the position of FIG. 13 over and on top of wafer 230 as shown in FIGS. 14 and 15 to sandwich the die 31 with traces 240, 241 and 242 contacting source metal 33, gate metal 34 and rims 52a, 52b respectively.

A conductive lead frame of conductive leads 250, 251, 252 may be soldered to traces 241, 240, 242 respectively and extend beyond the periphery of the sandwich to act as terminals for the device.

The traces 241, 240 and 242 may be connected to electrodes 34, 33 and 52a, 52b by solder or conductive epoxy or the like, and may be secured simultaneously with the adhering of lead frames 250, 251, 252 to traces 241, 240 and 242. Additional die and additional corresponding lead frame terminals can be added as desired for copacked die within the sandwich.

Figure 16:
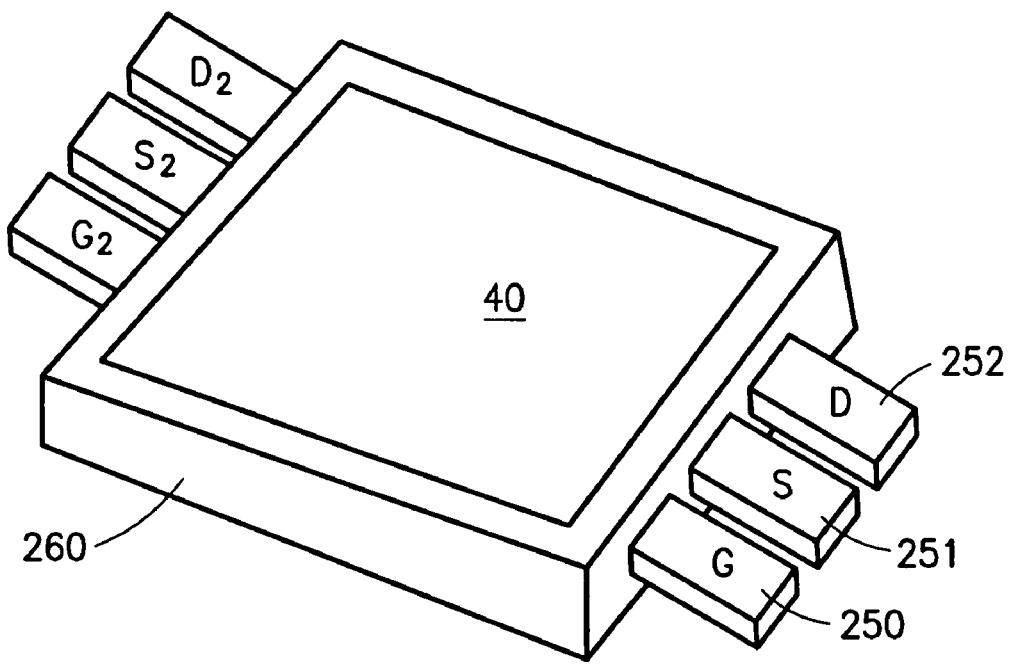
FIG. 16 is a perspective view of the package of FIGS. 13, 14 and 15.

The assembled sandwich of die 31, wafer 200 and wafer 230 can then be overmolded with any suitable known plastic insulation mold mass 260 (FIGS. 15 and 16) leaving the outer surfaces of copper conductors 40 and 232 exposed as shown in FIGS. 15 and 16.

The completed structure can now be cooled from both sides of die 31 and from insulated copper conductors 40 and 232 (FIGS. 14, 15 and 16) by air or liquid coolants.

Thus, in the novel assembly of FIGS. 13 to 16, the bottom DBC wafer 230 provides contact pads for the die 31 inside the DBC wafer 200. The die 31 can be any MOSgated device or diode or the like, and plural die can also be mounted in DBC wafer 200 and contacted by suitable conductive traces in lower DBC wafer 230. Thus, any copack of two or more die, for example, a high side and low side switch can be housed in a single sandwich.

Suitable means may be provided to align the top and bottom DBC wafers during soldering such as the dimple structure previously described, solder resists, adjustment elements and the like. Further, means can be provided to insure against arcing or voltage breakdown, and to increase the creepage or clearance distance between terminals such as isolating layers, solder stop resist, polyimide foils and the like. Selective etching can also be used to increase critical distances between the DBC "can", the semiconductor die and the bottom DBC. An underfill epoxy can also be employed.

Note that the sandwich of FIGS. 15 and 16 is very flat and, with a typical DBC wafer thickness of 1 to 1.5 mm, the sandwich thickness will be from 2 to 3 mm. The DBC wafer sandwich can have a length and width, for example, 10 to 15 mm, depending on the number of die within the sandwich. Where plural die are used, added lead frame terminals, for example terminals 270, 271 and 280 can be added to the assembly as shown in FIG. 16, and extending from the sandwich edge opposite to terminals 250, 251, 252. The various lead frame terminals can be customized in shape, thickness, material, plating and the like to a particular application.

It now becomes possible to mount the assembly of FIGS. 15 and 16 in such a way that two sided cooling can be easily carried out. Thus, two separate metal heat sink plates can be fixed to copper layers 40 and 232 in FIGS. 15 and 16 as by gluing or soldering or the like.

Figure 17:
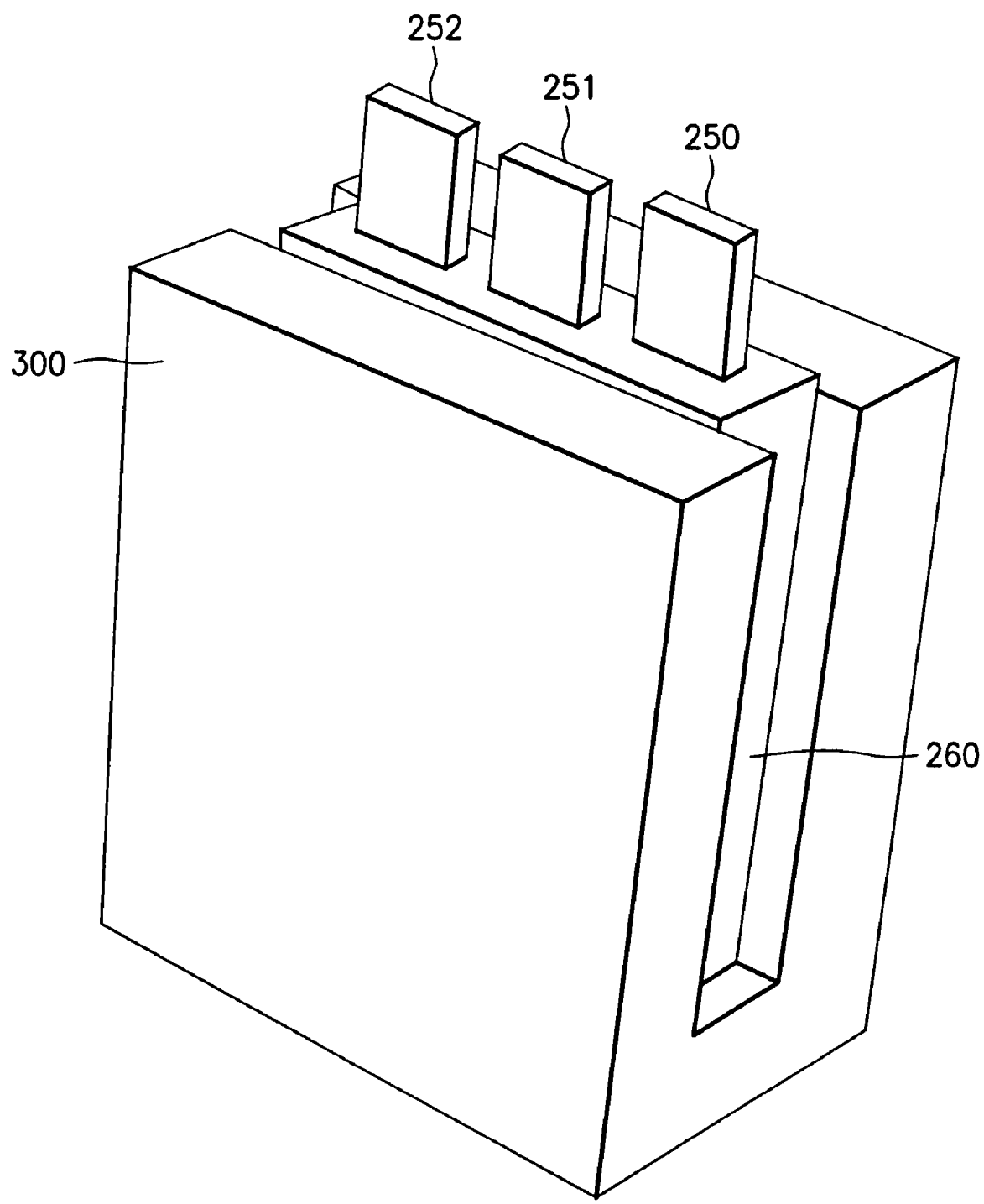
FIG. 17 is a perspective view of a U-shaped heat sink connected to the package of FIG. 16.

FIG. 17 shows a U-shaped metal clip 300 which can be mechanically sprung over the surfaces of copper layers 40 and 232 of FIGS. 15 and 16 and in pressure contact with those surfaces. Solder, thermally conductive glue or thermal grease can also be employed to ensure good cooling from both sides of the DBC sandwich.

Figure 18:
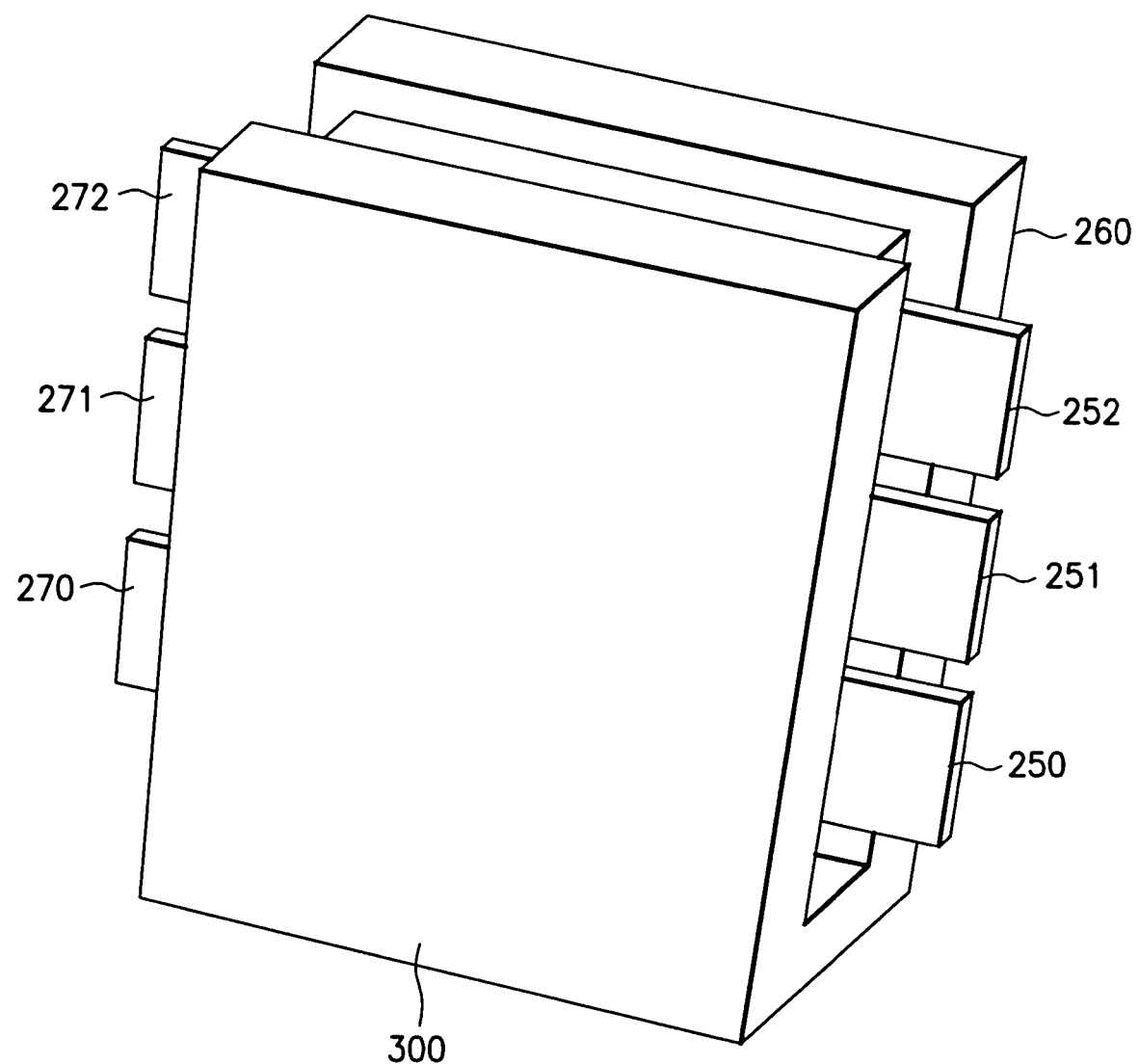
FIG. 18 is a perspective view of an alternative clip arrangement for the package of FIG. 16.

The clip 300 can be rotated to the position shown in FIG. 18 if two sets of leads 250, 251, 252 and 270, 271, 272 extend from the opposite sides of the housing and from insulated die within the housing.

Figure 19:
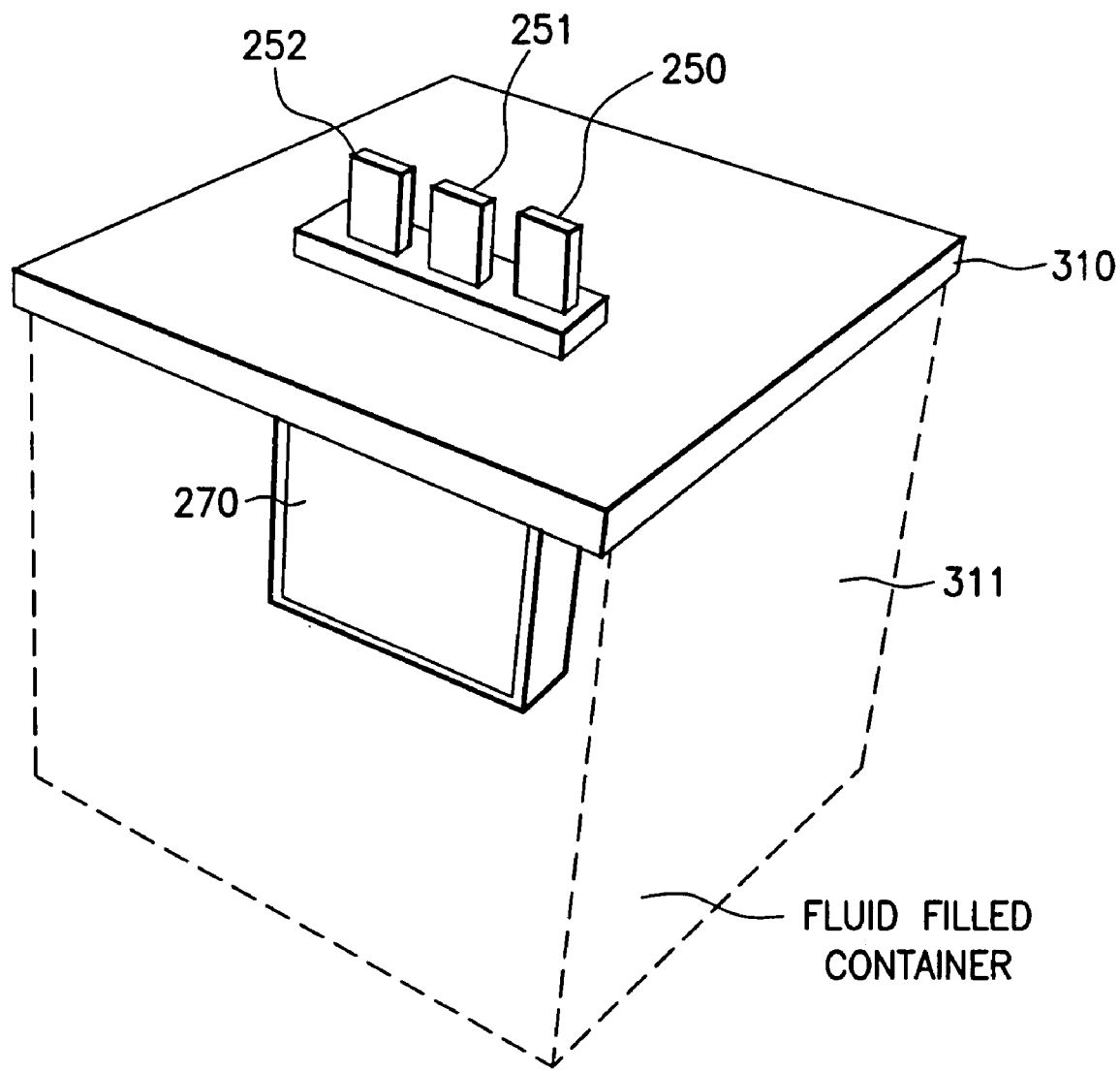
FIG. 19 is a perspective view of the package of FIG. 16 mounted in a liquid cooled chamber.

It is particularly possible with the assembly of FIG. 17 to expose the coolable surfaces to a cooling liquid since the terminals 250, 251 and 252 are insulated from copper plates 40 and 232. Thus, as shown in FIG. 19, the assembly 300 can be fixed at its end surface adjacent terminals 250, 251, 252 to a mounting plate 310 which seals the top of coolant reservoir 311. Coolant fluid can be circulated as desired within or into and out of chamber 311.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A thin flat semiconductor package comprising a semiconductor die having first and second power electrodes on its respective opposite first and second surfaces; first insulation plate having first and second conductive layers on its respective opposite surfaces which are insulated from one another; second insulation plate having a plurality of spaced first conductive layers on a first surface thereof and a second conductive layer on an opposite second surface thereof; said first and second power electrodes of said die being electrically and mechanically fixed to said first conductive layer on said first insulation plate and to one of said first conductive layers on said second insulation plate to define a sandwich of said first and second insulation plates with said die between them; and at least first and second lead conductors each electrically connected to a respective first conductive layer on said first surface of said second insulation plate and extending beyond the peripheral edge of said sandwich, whereby the second conductive layers of the first and second insulation plates are both exposed for cooling said die, wherein said first conductive layer of said first insulation plate has a flat central portion for receiving said die and a raised peripheral region, said second power electrode being electrically and mechanically connected to said flat central portion, and said raised peripheral region being electrically and mechanically connected to one of said first conductive layers on said first surface of said second insulation plate.

2. The package of claim 1, wherein said first and second insulation plates are thermally conductive ceramics.

3. The package of claim 1, wherein said silicon die has a conductive control electrode on its first surface; and a third lead conductor on said first surface of said second insulation plate connected to said control electrode and extending coextensively with said first and second lead conductors.

4. The package of claim 3, wherein said die is a MOSgated device.

5. The package of claim 1, wherein said silicon die has a conductive control electrode on its first surface; and a third lead conductor on said first surface of said second insulation plate connected to said control electrode and extending co-extensively with said first and second lead conductors; said pattern of said first conductive layer on said second insulation plate having a further pattern to conform to the shape of said control electrode.

6. The package of claim 1, wherein said package has a thickness less than about 4 mm.

7. The package of claim 5, wherein said package has a thickness less than about 4 mm.

8. The device of claim 1, wherein said first and second insulation plates and their conductive layers are formed in DBC substrates.

9. The device of claim 5, wherein said first and second insulation plates and their conductive layers are formed in DBC substrates.

10. The semiconductor package of claim 1, which further includes a U-shaped metal mounting clip wrapped around said package and pressed against and in good thermal communication with said second electrodes on said first and second insulation plates and spaced from and insulated from said power electrodes and said lead conductors.

11. The semiconductor package of claim 6, which further includes a U-shaped metal mounting clip wrapped around said package and pressed against and in good thermal communication with said second electrodes on said first and second insulation plates and spaced from and insulated from said power electrodes and said lead conductors.

12. The semiconductor package of claim 7, which further includes a U-shaped metal mounting clip wrapped around said package and pressed against and in good thermal communication with said second electrodes on said first and second insulation plates and spaced from and insulated from said power electrodes and said lead conductors.

13. A semiconductor package capable of being double sided cooled; said package comprising first and second patterned DBC wafers and at least one semiconductor die having first and second power electrodes; said first and second DBC wafer each having first and second conductive layers on opposite surfaces of a thin electrically conductive and electrically insulative plate; said first conductive layers each having a peripheral rim portion extending from a central flat region; said second power electrode of said semiconductor die connected to said central flat region of said first conductive layer of said first DBC layer; said first conductive layer of said second DBC wafer having a pattern conforming to the pattern of said first power electrode and to said peripheral rim of said first conductive layer of said first DBC wafer; said first DBC wafer being fixed to said second DBC wafer in sandwich fashion with said semiconductor die captured between the first and DBC wafers and with said first power electrode and said rim of said first conductive layer of said first DBC wafer electrically contacting respective regions on said pattern of said first conductive layer of said second DBC wafer; and lead conductors connected to said patterns of said first conductive layer of said second DBC wafer and extending beyond the periphery of said sandwich.

14. The package of claim 13, wherein said semiconductor die has a conductive control electrode on its first surface; and a third lead conductor on said first surface of said second insulation plate connected to said control electrode and extending co-extensively with said first and second lead conductors.

15. The package of claim 14, wherein said die is a MOSgated device.

16. The package of claim 13, wherein said package has a thickness less than about 4 mm.

17. The device of claim 1, which includes a second semiconductor die laterally spaced from the first mentioned die and having respective first and second power electrodes on its respective opposite surfaces; said first conductive layers on said first and second insulation plates having respective conductive pattern portions for making contact to said first and second power electrodes of said second die.

18. The device of claim 17, wherein said first and second die are a MOSgated device and a parallel connected diode respectively.

* * * * *

UNITED STATES PATENT AND TRADEMARK OFFICE
CERTIFICATE OF CORRECTION

| | | |
|---|---|---|
| PATENT NO. | : 7,619,302 B2 | Page 1 of 1 |
| APPLICATION NO. | : 11/751930 | |
| DATED | : November 17, 2009 | |
| INVENTOR(S) | : Hauenstein | |

It is certified that error appears in the above-identified patent and that said Letters Patent is hereby corrected as shown below:

In the claims, column 10, line 13, "first and DBC wafers" should be changed to "first and second DBC wafers."

Signed and Sealed this
First Day of November, 2011

David J. Kappos
*Director of the United States Patent and Trademark Office*